(12) United States Patent
Durben et al.

(10) Patent No.: US 7,775,363 B2
(45) Date of Patent: Aug. 17, 2010

(54) HIGH CLEANLINESS ARTICLE TRANSPORT SYSTEM

(75) Inventors: Joseph A. Durben, Woodland Park, CO (US); Gavin Charles Rider, Winscombe (GB); Robert K. Lindsley, Colorado Springs, CO (US)

(73) Assignee: Microtome Precision, Inc., Colorado Springs, CO (US)

( * ) Notice: Subject to any disclaimer, the term of this patent is extended or adjusted under 35 U.S.C. 154(b) by 0 days.

(21) Appl. No.: 12/507,959

(22) Filed: Jul. 23, 2009

(65) Prior Publication Data

US 2009/0277810 A1 Nov. 12, 2009

Related U.S. Application Data

(62) Division of application No. 11/893,901, filed on Aug. 17, 2007, now Pat. No. 7,581,372.

(60) Provisional application No. 60/838,256, filed on Aug. 17, 2006.

(51) Int. Cl.
B65D 85/48 (2006.01)
B65D 85/30 (2006.01)

(52) U.S. Cl. .................. 206/454; 206/710; 206/455

(58) Field of Classification Search ................ 206/454, 206/453, 455, 710, 722, 723, 724, 449, 711, 206/832, 833; 53/471, 467; 414/217.1; 355/75; 141/64

See application file for complete search history.

(56) References Cited

U.S. PATENT DOCUMENTS

| | | | |
|---|---|---|---|
| 4,422,547 A | 12/1983 | Abe et al. | |
| 4,776,462 A | 10/1988 | Kosugi et al. | |
| 4,815,912 A | 3/1989 | Maney et al. | |
| 4,842,136 A | 6/1989 | Nakazato et al. | |
| 5,296,893 A | 3/1994 | Shaw et al. | |
| 5,577,610 A | 11/1996 | Okuda et al. | |
| 5,725,100 A | 3/1998 | Yamada | |
| 5,890,597 A * | 4/1999 | Fan et al. | 206/710 |
| 5,960,959 A * | 10/1999 | Wu et al. | 206/710 |
| 6,216,873 B1 | 4/2001 | Fosnight et al. | |
| 6,825,916 B2 | 11/2004 | Wiseman et al. | |
| 7,032,758 B2 * | 4/2006 | Pai et al. | 206/710 |
| 7,236,233 B2 | 6/2007 | Heerens et al. | |
| 7,259,835 B2 | 8/2007 | Matsutori et al. | |
| 7,450,219 B2 | 11/2008 | Matsutori et al. | |
| 7,618,225 B2 * | 11/2009 | Chen et al. | 414/416.03 |

(Continued)

OTHER PUBLICATIONS

In the United States Patent and Trademark Office re U.S. Appl. No. 11/893,901, Non-Final Office Action dated Dec. 12, 2008, 6 pages; and response dated Apr. 22, 2009, 5 pages.

*Primary Examiner*—Mickey Yu
*Assistant Examiner*—Steven A. Reynolds
(74) *Attorney, Agent, or Firm*—Patton Boggs LLP

(57) ABSTRACT

A semiconductor reticle transportation container includes a box and a base, the box having an opening and the base including a reticle support. The reticle is placed on the support and the box is placed on the base so that the reticle passes through the opening while being lifted off of the support by plungers contacting the lower edge of the reticle. After the box is closed, the reticle is compliantly constrained horizontally and vertically and is held away from the support.

10 Claims, 6 Drawing Sheets

U.S. PATENT DOCUMENTS

| | | |
|---|---|---|
| 7,648,041 B2 * | 1/2010 | Ueda et al. .................. 220/378 |
| 2002/0066692 A1 | 6/2002 | Smith et al. |
| 2002/0195455 A1 * | 12/2002 | Takahashi et al. ........... 220/806 |
| 2004/0004704 A1 | 1/2004 | Wiseman et al. |
| 2004/0005209 A1 | 1/2004 | Su et al. |
| 2004/0124118 A1 * | 7/2004 | Matsutori et al. ........... 206/710 |
| 2005/0056441 A1 | 3/2005 | Rider et al. |
| 2005/0117142 A1 | 6/2005 | Heerens et al. |
| 2005/0229145 A1 | 10/2005 | Irby et al. |
| 2005/0247594 A1 * | 11/2005 | Mimura et al. ............... 206/710 |
| 2006/0000747 A1 * | 1/2006 | Wright et al. ................ 206/710 |
| 2006/0126052 A1 | 6/2006 | Matsutori et al. |
| 2006/0213797 A1 | 9/2006 | Nozaki et al. |

* cited by examiner

HIGH CLEANLINESS ARTICLE TRANSPORT SYSTEM

CROSS-REFERENCE TO RELATED APPLICATIONS

This Application is a Divisional of U.S. patent application Ser. No. 11/893,901 filed on Aug. 17, 2007, which application is a Non-Provisional of Provisional (35 USC 119(e)) Application No. 60/838,256 filed on Aug. 17, 2006. Both the provisional and non-provisional applications are hereby incorporated by reference to the same extent as though fully contained herein.

FIELD OF THE INVENTION

The invention relates to portable containers for allowing articles to be transported and processed while maintaining very high levels of cleanliness, particularly containers for holding reticles used in the integrated circuit and other microscopic device manufacturing industry.

BACKGROUND OF THE INVENTION

A reticle is an optically clear or reflective substrate covered on one side with an opaque or light attenuating film, in which a pattern is formed by photolithography or other similar processes. Often, it is made of quartz coated with chrome. The reticle carries an image of part of an electrical circuit, which image is used as a master for repeated projection onto a semiconductor wafer to make integrated circuits. During production of the reticle, the coated side is held uppermost and the reticle is supported on its uncoated side or is held by the beveled edges/corners during handling and processing. After the reticle has passed final inspection, a pellicle may be attached to the coated side to help protect the image area from particulate deposition and chemical contamination. The reticle then is placed into a shipping box that is sealed to protect it from contamination while in transit to the semiconductor factory where it will be used. Upon arrival at the point of use, the reticle is transferred into another box which is designed so that it can be opened automatically by the lithography tool that uses the reticle. The reticle is placed in this box with the coated side (and pellicle, if fitted) facing downwards, typically resting on support points that contact the coated underside of the reticle in the region outside the pellicle frame.

The rigid structures that laterally define the reticle containment volume in the box cannot prevent the reticle from moving on the support points, as there must be clearance space between such boundary structures and the reticle to allow for dimensional and positional tolerances of the box parts and of the reticle itself, as well as the placement accuracy of the handling mechanism that moves the reticle into and out of the box. Current implementations of reticle boxes either restrict reticle movement when the box is closed by applying a downward force on the reticle to hold it against the support points or by moving a retaining mechanism against a vertical side of the reticle to hold it against a rigid vertical structure in the box. Examples of such mechanisms can be found in U.S. Pat. No. 4,815,912 and US Patent Application Publication No. 2002/0066692.

The prior art which clamps the reticle onto the support points by applying a downward force on the reticle increases the friction at the reticle support points; and if the reticle moves sideways under such conditions, for example as a result of shock loading, there is an increased risk of damage to the coating on the reticle or of particulate generation from the supports. In some designs, the sprung structures that apply the downward force to clamp the reticle are also designed to center the reticle in the pod. In such designs, lateral reticle movement under increased friction at the supports is induced every time the pod is closed. Even if the reticle does not move sideways, the application of pressure between the reticle and the support points can cause material from the supports to adhere to the reticle and/or cause material of the reticle coating to adhere to the supports. If the box is made from molded plastic material, the clamping force is likely to have a distorting effect on the walls and door of the box. It is well-known from experience with plastic Standard Mechanical Interface (SMIF) doors in multi-reticle handling that such distortions result in dimensional instability of the assembly and cause handling errors due to displacement of the reticle from the nominal plane that is addressed by the handling robot.

In the prior art designs in which the reticle is restrained in the box laterally but with no downward pressure on the reticle other than the force of gravity, there is a possibility of vertical reticle movement if the box is tipped or the reticle experiences negative g-forces during handling. This will allow the reticle to "bounce" on the supports and can also lead to damage of the coating on the reticle or to particle generation at the support points.

Particle generation at the support points in a reticle box has been identified as a cause of image distortion during exposure in a lithography tool. Such particles can become trapped between the reticle and the support surface in the lithography tool onto which the reticle is clamped, normally by vacuum. As the clamping force is large, the reticle can be distorted which causes image distortions and printing faults known as "overlay errors" which cannot be fully corrected by adjusting the settings of the lithography tool.

The latest generations of reticle boxes are designed such that the support points do not coincide with the vacuum chucking points that are used to support the reticle in the lithography tool, and some lithography tool chucks have been designed to be insensitive to the presence of particles. Nevertheless, damage to the coating or the generation of particles from the supports on the underside of a reticle is always undesirable, since particles can be transferred to other sensitive areas of the reticle or processing equipment by subsequent handling and by air showers.

Some reticles are manufactured with the opaque coating removed in the regions of the reticle contact points so that the coating cannot be damaged and cause particle generation, for example, as described in US Patent Application Publication Nos. 2005/0229145 and 2004/0005209. However, particle generation is not eliminated completely by removing the coating in the support areas, since the support material of the box typically is softer than that of the reticle, and it can also be damaged and generate particles through the action of pressure and/or friction when it is in contact with the reticle surface.

To reduce the generation of particles on sensitive areas of a reticle, the support points used in some reticle boxes are placed at the corners/edges so that the major surfaces of the reticle are not touched at all, as described in US Patent Application Publication Nos. 2006/0126052 and 2002/0066692 and in U.S. Pat. No. 6,216,873. However, such support configurations generally are not used in semiconductor production facilities due to their incompatibility with the designs of existing lithography equipment and reticle handling systems. The use of boxes employing such support points, therefore, is restricted to reticle shipment or within reticle manufacturing areas, so reticles must be transferred from this type of box to another type at least once during the reticle's journey from its place of manufacture to its point of use in a semiconductor fabrication facility. This exposes reticles to increased risk of contamination and electrostatic damage, especially if the transfer is done manually. Automating this transfer of reticles between boxes increases cost, occupies valuable clean room space with handling equipment, and introduces extra reticle handling steps.

BRIEF SUMMARY OF THE INVENTION

This invention provides a universal protective environment for reticles that is equally applicable during their manufacture and for their shipment to and subsequent use in a semiconductor fabrication facility.

The present invention addresses the problems outlined above by providing a box with conventional reticle support points and additional internal mechanisms to lift the reticle off the supports and contact it only at the corners/edges when the box is closed. This renders the box suitable for use with a reticle after patterning and photoresist removal, at which time the reticle can be handled with its coated side facing downward. Hence, it can be used for the final stages of reticle manufacture, such as when the reticle is inspected and the pellicle is fixed to it, and for shipment to the end user. The reticle can be shipped in the box without any risk of damage occurring at the designated support areas on the underside of the reticle which are used in the boxes in the semiconductor production facility. The box can be introduced directly into the semiconductor fabrication facility, as there is no need to transfer the reticle to another box for use on a lithography tool. The box can continue in use within the semiconductor fabrication facility, or it can be exchanged for another type of box on any compatible tool load port and returned to the reticle manufacturer to be used for further reticle manufacture and transportation. Alternatively, the clamping mechanisms in the box can be exchanged for mechanisms that center the reticle on the supports but do not clamp it.

A first basic embodiment of an apparatus in accordance with the invention comprises a reticle standard mechanical interface (SMIF) pod which is equipped with internal mechanisms that, upon closure of the pod, lift the reticle off the essentially rigid support points that were used to receive the reticle into the pod and thereafter support the reticle on the lower edges/corners. A further embodiment couples the lifting action with sprung receptors or stops mounted in the pod top section which contact the upper edges/corners of the reticle, such that the reticle is clamped within the pod top by contact with the edges/corners only and is held in a raised position above the rigid supports that are used to receive the reticle into the pod. Preferably, the corners/edges of a standard reticle are nominally beveled at 45°, and the contact surfaces of the reticle lifting mechanisms and sprung receptors have reticle contact surfaces that are similarly oriented. The combination of angled contact surfaces and sprung receptors allows operation with reticles of varying size and thickness while ensuring that all reticles are securely but compliantly held away from the rigid supports and are centered laterally within the pod. The compliant receptors in the pod top also provide a cushioning effect against shocks that may be experienced during transit, helping to prevent damage to the reticle.

Any application of a clamping force to a reticle may generate particles, so it may be desirable to minimize this during normal use of the reticle. If it is preferred that the reticle should not be clamped when used within the semiconductor fabrication facility, the clamping mechanisms in the pod preferably are replaced by mechanisms that center the reticle and restrain it laterally and vertically without applying a clamping force.

In one preferred embodiment, the rear edge of the reticle is restrained by a vertical panel which is immovably fixed to the pod door and which defines a positioning reference plane for the rear edge of the reticle. In some preferred embodiments, the container will be made from material that is sufficiently conductive that it provides an electrically shielded environment for the reticle within, i.e., it is a Faraday cage. In accordance with the previous invention disclosed in US Patent Application Publication No. 2005/0056441, the mechanisms that lift and receive the reticle, as well as the rigid support and retaining structures in such an embodiment, may be made substantially from electrically insulating materials to isolate the reticle from the electrically conductive container. Some embodiments may incorporate one or more gas-tight seals between the separate parts of the container, such that the environment within the closed container remains chemically controlled and isolated from the external environment. One preferred embodiment features a compressible gasket between the separable parts of the box which bears on an inclined surface, which configuration serves to center the door in the box and restrict lateral motion while also providing a gas tight seal. Other embodiments preferably include gas purging, filtration, and/or pressure conditioning ports to allow the pod to be filled and purged with a chosen gas or to withstand pressure variations during shipment without allowing the ingress of gaseous contaminants from outside the pod. A further embodiment preferably includes chemical absorbent material within the pod to remove airborne compounds that might lead to degradation of the reticle.

The invention provides a transportable container comprising: a box having an opening; a base having dimensions arranged to fit in and seal the opening; a support attached to the base for supporting an article to be transported, the support located on the base so that it passes through the opening in a first direction when the box is placed on the base; a rail fixed to the box; a block movable on the rail, a component of the movement being in the first direction, the block including a guide channel having a directional component perpendicular to the first direction; a plunger movable in the guide channel and having an end face adapted to engage an article on the support; and a link pivotably mounted on the rail and connected to the plunger. Preferably, the guide channel is along a direction perpendicular to the first direction. Preferably, the plunger end face is aligned along a direction at an angle to the first direction. Preferably, the plunger end face is aligned substantially in a direction 45° to the first direction. Preferably, the container further includes a gasket for sealing the opening, and the opening has a gasket-engaging surface for engaging the gasket. Preferably, the gasket-engaging surface is at an angle to the perpendicular to the first direction. Preferably, the angle is substantially 45°. Preferably, the container further includes a compliant pad on the end face of the plunger. Preferably, the container further comprises gas purging, filtration, and/or pressure conditioning ports to allow the container to be filled and purged with a chosen gas or to withstand pressure variations during shipment without allowing the ingress of gaseous contaminants from outside the container. Preferably, the container further comprises chemical absorbent material within the container to remove airborne compounds that might lead to degradation of the reticle.

The invention also provides a method of transporting a semiconductor reticle, the method comprising: providing a transportation container including a box and a base, the box having an opening and the base including a reticle support; placing a reticle on the support; and placing the box on the base so that the reticle on the support passes through the opening while engaging the reticle with a horizontally movable plunger. Preferably, the engaging comprises lifting the reticle off of the support, the lifting defining a vertical direction. Preferably, the lifting comprises engaging the reticle at its lower edges or corners. Preferably, the lifting comprises engaging the reticle with angled contact surfaces. Preferably, the method further includes engaging the upper edges or corners of the reticle. Preferably, the method further comprises placing a vertical stop in a position just above the reticle without engaging the reticle. Preferably, the method further comprises retracting the plungers while opening the container so that they do not interfere with removal of the reticle from the support. Preferably, the method further comprises, after the reticle is transported to a desired location, restraining it laterally and vertically in the box at a safe distance from the support until the box is opened. Preferably, there is no relative motion between the plungers and the reticle after the plungers engage the reticle.

The invention also provides a method of transporting a semiconductor reticle, the method comprising: providing a transportation container including a box and a base, the box having an opening and the base including a reticle support; placing a reticle on the support; and placing the box on the base so that the reticle on the support passes through the opening while lifting the reticle off of the support, the lifting defining a vertical direction.

The invention provides a box which protects a field-sensitive article, such as a patterned reticle, from mechanical damage, chemical and physical contamination, the effects of externally generated electric fields, and also from the effects of being electrically charged, within a reconfigurable container that is compatible with all of its handling environments. The above and other advantages of the present invention may be better understood from a reading of the following description of the preferred exemplary embodiments of the invention taken in conjunction with the drawings.

BRIEF DESCRIPTION OF THE DRAWINGS

A more complete understanding of the invention may be obtained by reference to the drawings, in which.

DETAILED DESCRIPTION OF THE INVENTION

The invention is described herein with reference to FIGS. 1-7. It should be understood that the structures and systems depicted in schematic form in FIGS. 1-7 are used to explain the invention and are not precise depictions of actual structures and systems in accordance with the invention. The preferred embodiments described herein are exemplary and are not intended to limit the scope of the invention, which is defined in the claims below. Embodiments in accordance with the invention are described herein mainly with reference to the handling of reticles in standard mechanical interface (SMIF) pods. It is understood, however, that the invention would be applicable to other kinds of containers and also would be useful for protecting a wide variety of articles, particularly in semiconductor manufacturing facilities. In this disclosure, when vertical and horizontal directions are mentioned, they refer to the corresponding directions in FIGS. 2 and 4-7.

Figure 1:
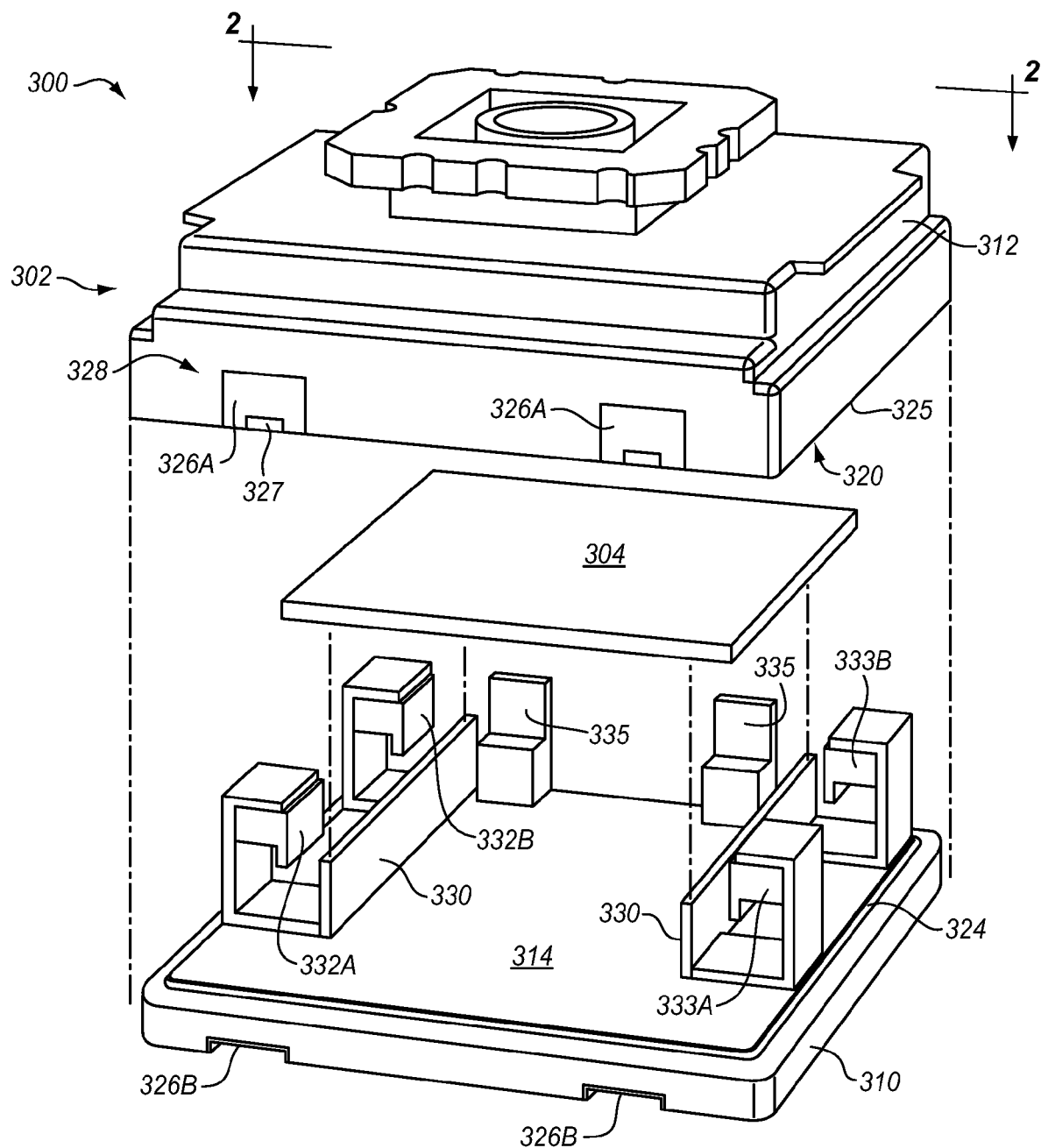
FIG. 1 is an exploded perspective view of a conventional reticle standard mechanical interface (SMIF) pod as is currently used in semiconductor production facilities.
Figure 2:
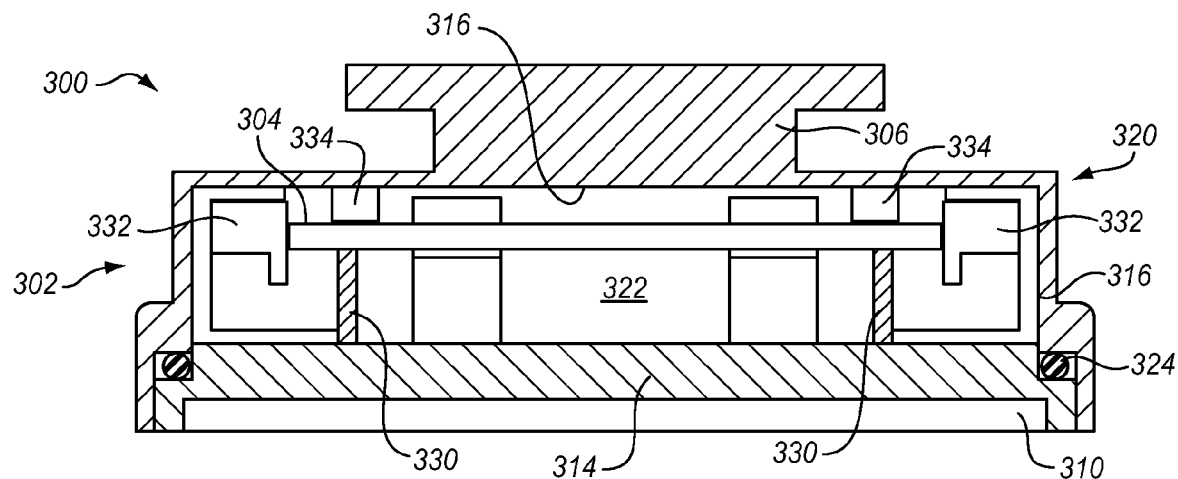
FIG. 2 shows a cross-section in the direction of lines 2-2 of FIG. 1 of the conventional reticle SMIF pod of FIG. 1 in a closed position holding a reticle.
Figure 3:
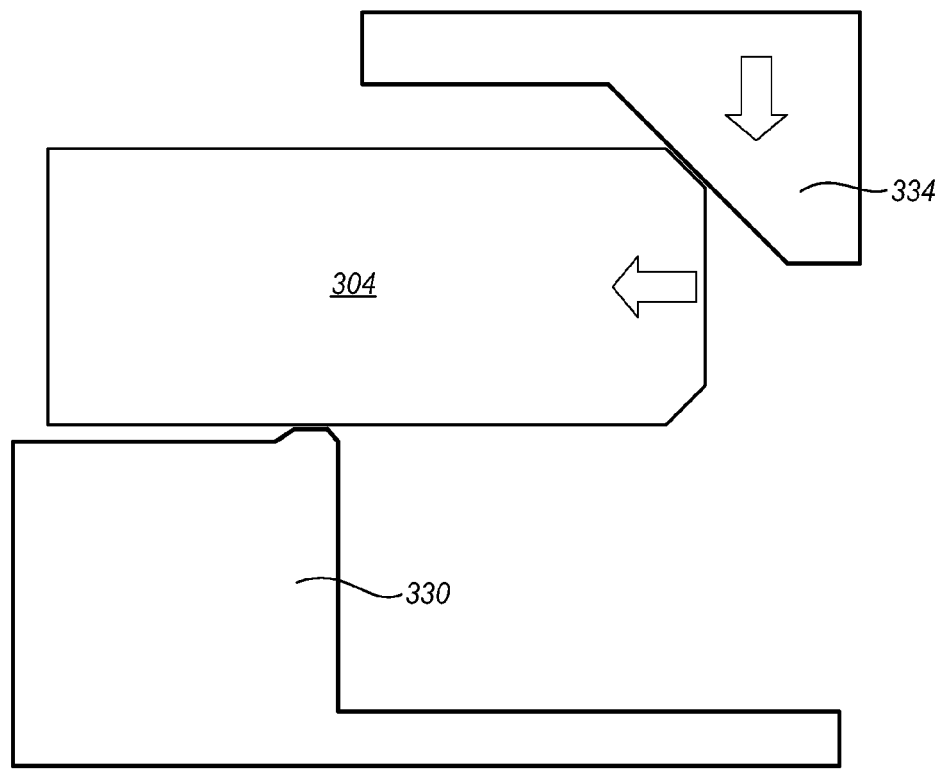
FIG. 3 schematically illustrates a conventional reticle centering and clamping mechanism that creates increased friction at the fixed reticle support points.

FIGS. 1-3 schematically illustrate reticle standard mechanical interface (SMIF) pods that currently are used in semiconductor production. The pod 300 is constructed in two separable parts, the top box section 302 and the base section 314, which are held together when the pod is closed, typically by a locking mechanism 328. An automation handle 306 preferably is integrally formed with top section 302. This handle allows automated systems to lift the pod robotically. The locking mechanism 328 comprises lock sections 326A affixed to the top, the locks having movable tenons 327 which engage mortises 326B on the base 314, the combined action of which compresses the compliant gasket 324 to form a gas tight seal between the two parts 314 and 302. It is normal for the sealing face 325 in the pod top, against which the gasket is compressed, to be disposed horizontally which allows for lateral movement of the base 314 within the opening 320 in the pod top 302. The reticle 304 is placed on the pod base by hand or by a robotic end effector and is supported on rigid supports 330, being laterally constrained between fixed vertical boundaries 332A and 332B. Reticle 304 is held against the rear vertical boundary 335 by a movable restraint mechanism 334 (FIG. 3) that pushes the reticle 304 rearward when the pod is closed. The reticle 304 is held in contact with the supports 330 in the closed pod by sprung stop mechanisms 334 that are fixed inside the pod top section 302. The force applied vertically downward on the reticle supports 330 by sprung stop mechanisms 334 increases the friction at the support points, as well as acting to resist lateral motion of the reticle 304 on the supports 330 and lateral motion of the pod door base within the opening in the pod top. This friction increases the likelihood of particle generation at the reticle support points.

Figure 4:
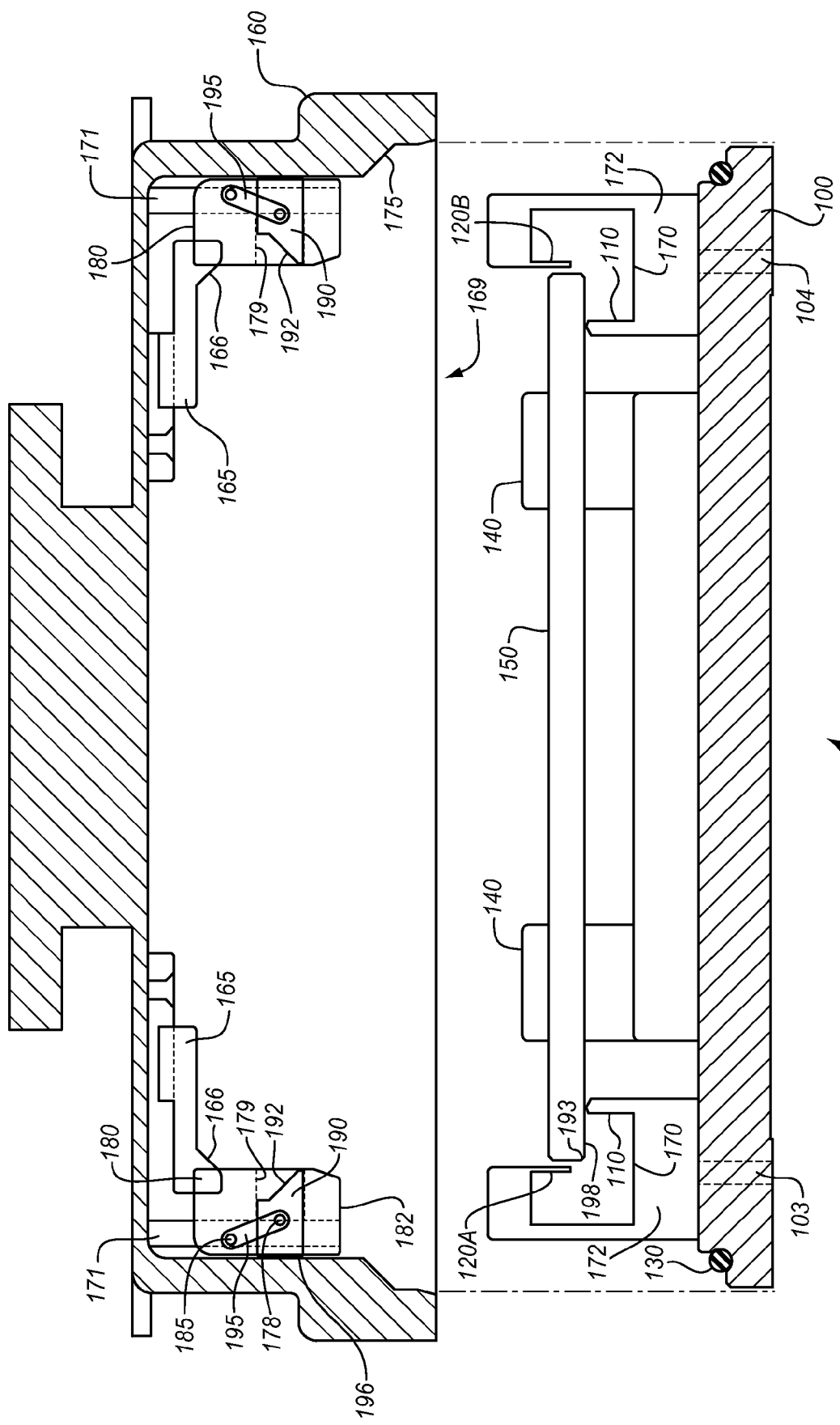
FIG. 4 shows a side-view cross-section of a container according to the invention designed to carry a reticle in isolation from the fixed supports in the open position.

FIG. 4 schematically depicts a front cross-sectional view of an apparatus 90 in accordance with the present invention for raising a reticle off the supports that receive it when it is placed in a SMIF pod and compliantly restraining it at a safe distance from the supports when the pod is closed. When the pod is opened, again the reticle is lowered back onto the conventional supports allowing the reticle to be accessed by a conventional retrieval mechanism.

The apparatus 90 comprises a container made from two separable sections, the base section 100 and the box section 160, having an opening 169 which can be sealed by bringing both together so that they compress the compliant gasket 130. The container is maintained in the closed position by the same type of locking mechanism 328 as shown in FIG. 1. The apparatus includes fixed supports 110 configured for receiving a reticle 150 into the container. There are fixed lateral restraint structures 120A and 120B mounted at either side of the base 100 which define the edges of the placement volume for the reticle when it is received into the container. At the rear side of the base 100 is a fixed vertical boundary wall 140 which acts as a reference plane for the handling system when the reticle is received into or collected from the container by hand or an external robotic mechanism accessing the container from the front side. The top section 160 holds fixed rails 171 which guide moving blocks 180 and constrain them to execute vertical motions along the fixed rails. Movably housed reticle lifter plungers 190 fitting into guide channels 179 in the moving blocks 180 have an end face 192 that is beveled upwardly facing the edge of the reticle. The guide channels preferably are horizontal. However, one skilled in the art will recognize that the guide channels determine the direction of movement of plungers 190. So long as the guide channels have a directional component in the horizontal direction, the plungers will also have a directional component in the horizontal direction and thus be able to engage the reticle. In a preferred embodiment, the beveled end face 192 is set at 45° to match the standard angle of the edge bevel on the reticle. In alternative embodiments, the angle may be set such that it matches any other angle that may be used on the edge bevel of the object to be carried, or the end face may have a convex surface providing a variety of possible contact angles against the edge of the object to be carried. The reticle lifter plungers 190 are coupled to the fixed rails 171 through rigid links 195, which links are connected at one end to the block 180 via a pivot pin 185 and at the other end to the plunger 190 via pivot pin 178. When the container is opened and the base 100 is moved vertically away from the top 160, the moving blocks 180 fall under the action of gravity, or, alternatively, a built-in spring, until their motion is stopped by the reticle lifter plungers 190 being pulled by the links 195 into contact with the inner surface 196 of the top 160. In this position, the reticle lifter plungers 190 are fully retracted inside the moving blocks 180 which are at their lower limit of travel relative to the top section 160. The reticle 150 can now be placed on the supports 110 either manually or by an automation system accessing the container from the front side.

As the base 100 and its fixtures supporting the reticle 150 are moved vertically into the top 160, the reticle 150 passes between the moving blocks 180 without touching them because they are outside the reticle placement volume defined by the lateral restraint structures 120. The bottom surfaces 182 of the moving blocks 180, sliding on fixed rails 171, then come into contact with the surface 170 of fixed structures 172 or with the base 100 and are pushed upwards into the top 160 as the container is closed. From this point, until the reticle is lifted from the supports, there is no relative vertical motion between the moving blocks and the reticle. Also, there is no lateral motion of the moving blocks 180 at their contact points with the base 100 or the attached structures 170, minimizing the chance of particulate generation at these points. As the base 100 continues to move upward into the top 160, the reticle lifter plungers 190 move horizontally inward toward the reticle under the action of the links 195, driving them within guide channels 178 in the moving blocks 180. The beveled surfaces 192 at the end of the reticle lifter plungers 190 first pass under the lower surface 198 of the reticle 150 and then come into contact with the lower beveled edges 193 of the reticle 150. As the reticle lifter plungers 190 continue to move, the reticle is forced upward by sliding on the beveled ends 192 of the reticle lifter plungers 190.

The upper edges of the reticle 150 next come into contact with the sprung receptors 165 that are fixed inside the top 160. These sprung receptors 165 have beveled surfaces 166 that contact the reticle at its upper beveled edges. In a preferred embodiment, the bevel is set at 45° to match the standard angle of the edge bevel on the reticle. In alternative embodiments, the angle may be set such that it matches any other angle that may be used on the edge bevel of the object to be carried, or the end face may have a convex surface providing a variety of possible contact angles against the edge of the object to be carried. As the reticle continues to rise under the action of the reticle lifter plungers 190, it is both centered laterally and clamped compliantly by the structures that now constrain it. In a preferred embodiment, the spring force applied by the sprung receptors 165 is chosen such that the reticle can be lifted and clamped using the force applied by the weight of the pod top 160 alone, so that extra friction is not caused at the pod locks. The upward motion of the reticle ceases when the container reaches the closed position and the gasket 130 is compressed between the base 100 and the top 160. In a preferred embodiment, the gasket is disposed to seal against a surface 175 that is angled at approximately 45° to the horizontal plane. This creates a compression force in the gasket that also serves to center the pod base 100 within the opening in the pod top 160 and resist any lateral movement, thereby minimizing the chance of relative movement of the parts of the pod which might cause particle generation during transportation.

Figure 5:
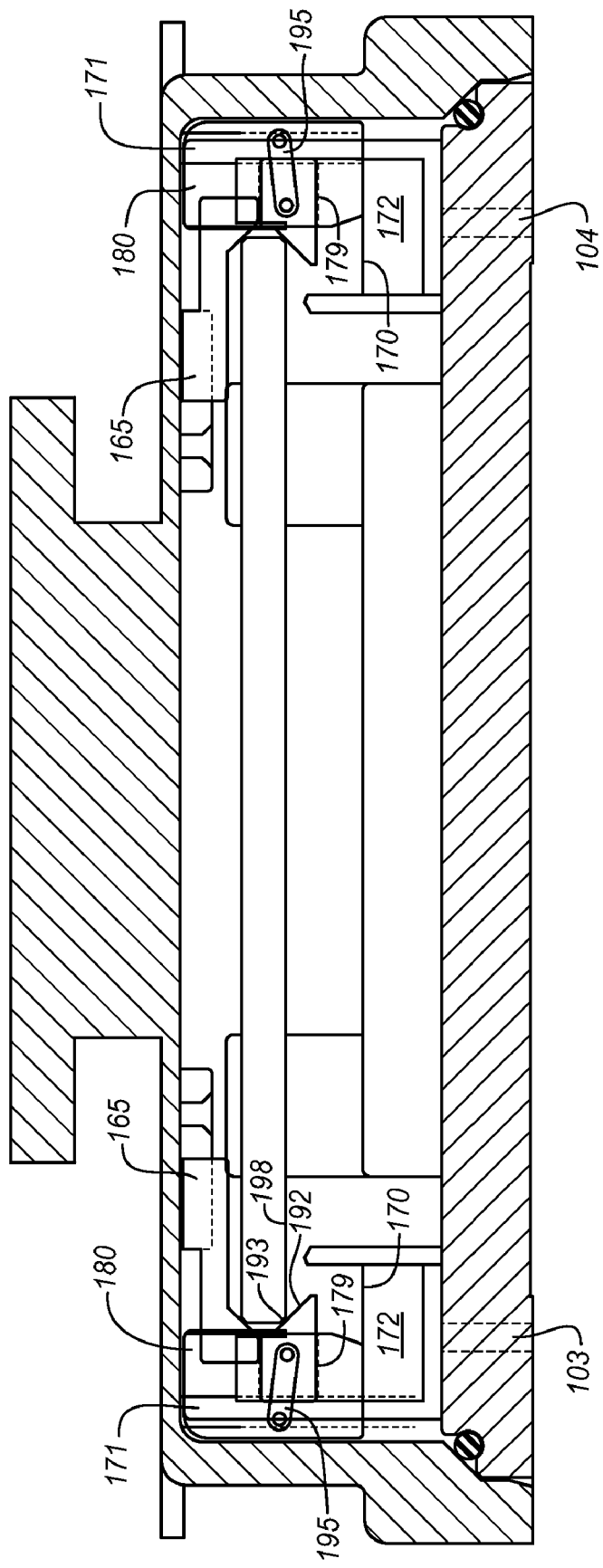
FIG. 5 shows a side-view cross-section of the container of FIG. 4 in the closed position.
Figure 6:
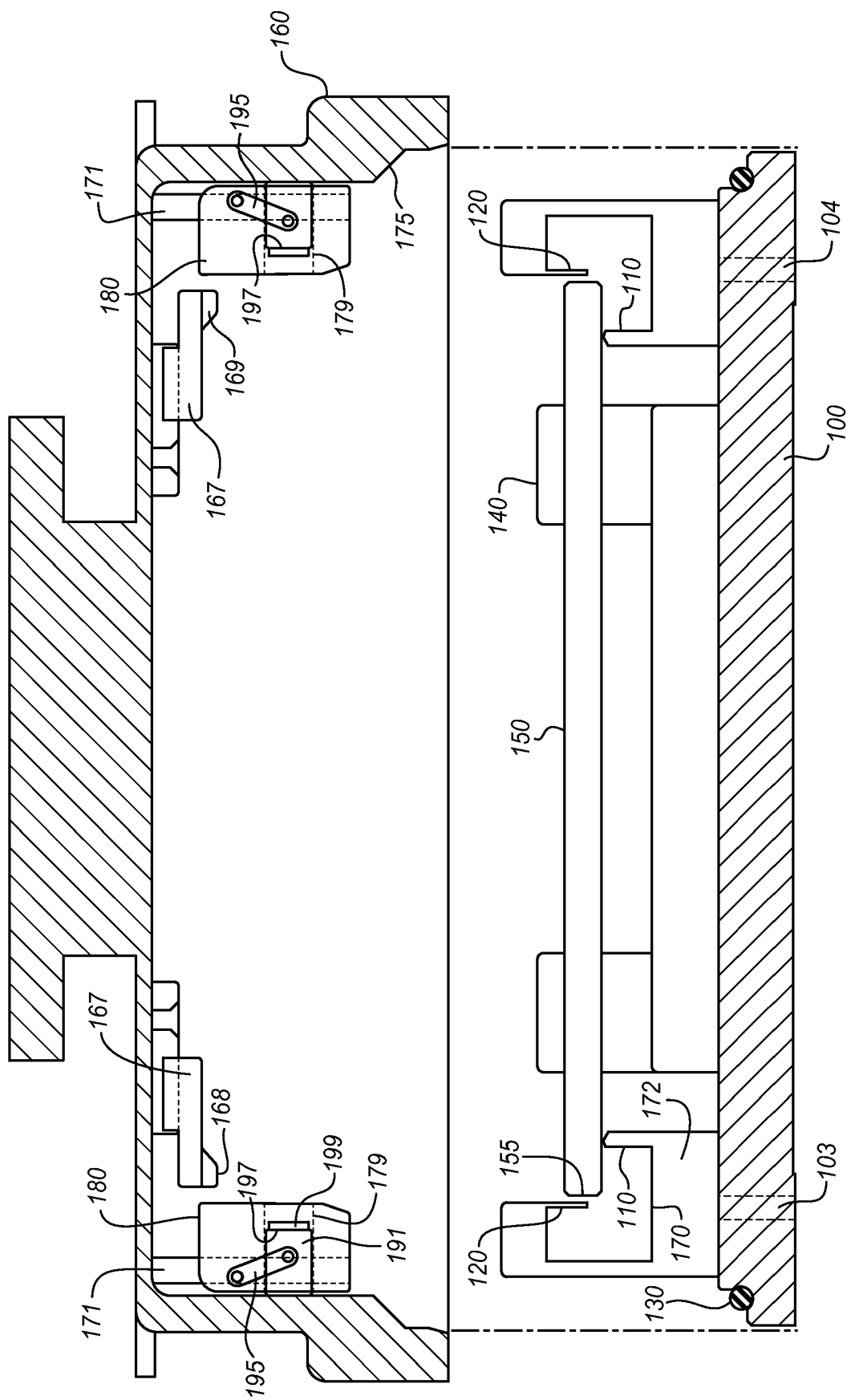
FIG. 6 shows a side-view cross-section of a container according to the invention designed to center a reticle without applying additional downward force on the reticle, in the open position.
Figure 7:
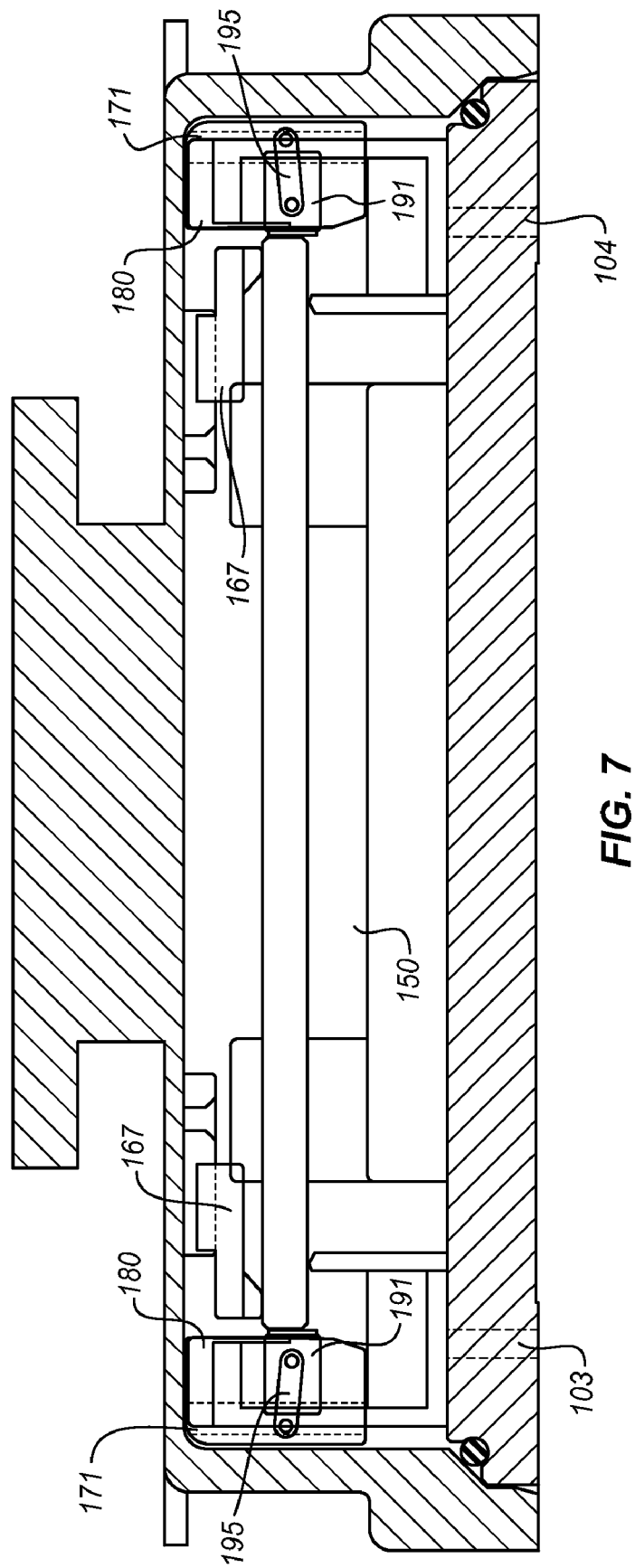
FIG. 7 shows a side-view cross-section of the container of FIG. 6 in the closed position.

FIG. 6 schematically depicts alternative internal structures for the pod which are interchangeable with those shown in FIGS. 4 and 5. In this configuration, the reticle lifter plungers 190 are replaced by reticle centering plungers 191 with vertical end faces 197, which push on the vertical edges 155 of the reticle 150, sliding it on the supports 110, and centering it laterally within the pod. The same mechanism (not shown) located at the front side of the pod also has a vertical end which bears on the front vertical edge of the reticle 150, pushing it against the fixed rear retainer 140. As there is no relative vertical motion between the plungers 191 and the vertical sides of the reticle 150, there is a low probability of particle generation at these contact points during the reticle centering process. In one possible embodiment of the invention, the vertical end faces 197 of the plungers 191 are fitted with compliant pads 199 such that they will compliantly and safely absorb impact forces that may be experienced during mishandling of the pod. Such compliant pads may also be designed to accommodate the small dimensional variations between different reticles. FIG. 6 also shows gas purging, filtration, and/or pressure conditioning ports 103, 104 to allow the pod to be filled and purged with a chosen gas or to withstand pressure variations during shipment without allowing the ingress of gaseous contaminants from outside the pod. A further embodiment, such as shown in FIG. 2, may preferably include chemical absorbent material 316 within the pod to remove airborne compounds that might lead to degradation of the reticle.

The sprung receptors 165 similarly are replaced by sprung buffers 167 which have horizontal lower surfaces 168 facing the upper surface of the reticle 150 but which do not contact the reticle 150 and, hence, do not create a downward force on the supports 110. As the force exerted by the reticle 150 on the supports 110 is only that imposed by gravity and no additional downward force is applied, the probability of particle generation at the supports during reticle centering is kept to a minimum. The sprung buffers 167 serve to compliantly and safely absorb any vertical force that may be caused due to mishandling of the pod. In a preferred embodiment, the horizontal lower surfaces may be fitted with compliant pads 169 to minimize any possible abrasion of the upper surface of the reticle.

In a preferred embodiment of the invention, all the structures that contact the reticle or come into close proximity with it are made from substantially insulating material such that any electric fields in the vicinity of the reticle are not perturbed by them. Preferred materials would be polymers such as PEEK, acetron, PTFE, or nylon, which have self-lubricating properties and, hence, low friction at the contact points with the reticle. Furthermore, these structures preferably are electrically insulating so that the reticle is electrically isolated from the container walls, which may be substantially electrically conductive to act as a shield against penetration of electric fields as described in US Patent Application Publication No. 2005/0056441.

A further embodiment of the system would be applicable to a container designed to carry multiple reticles, as described in International Patent Application WO01/081203. In such an embodiment, the centering plungers 191 are arranged as a vertical bar that pushes simultaneously on all the reticles held in the cassette, or as individual plungers such that each reticle is centered by a single centering device.

The particular systems, designs, methods and compositions described herein are intended to illustrate the functionality and versatility of the invention, but should not be construed to be limited to those particular embodiments. Systems and methods in accordance with the invention are useful in a wide variety of circumstances and applications to control and reduce damage to sensitive articles, especially in semiconductor manufacturing facilities. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods, and compositions described in the claims below and by their equivalents.

What is claimed as new and desired to be protected by Letters Patent of the United States is:

1. A transportable container comprising:
   a box having an opening;
   a base having dimensions arranged to fit in and seal said opening;
   a support attached to said base for supporting an article to be transported, said support located on said base so that it passes through said opening in a first direction when said box is placed on said base;
   a rail fixed to said box;
   a block movable on said rail, a principal component of said movement being in said first direction, said block including a guide channel formed in said block and having a principal directional component along a second direction perpendicular to said first direction, said second direction being toward the position in which said article would be when supported by said support;
   a plunger movable in said guide channel and having an end face adapted to engage an article on said support; and
   a link pivotably mounted on said rail and connected to said plunger.

2. A container as in claim 1 wherein said guide channel is along a direction perpendicular to said first direction.

3. A container as in claim 1 wherein said plunger end face is aligned along a direction at an angle to said first direction.

4. A container as in claim 1 wherein said plunger end face is aligned substantially in a direction 45° to said first direction.

5. A container as in claim 1, and further including a gasket for sealing said opening, and said opening has a gasket-engaging surface for engaging said gasket.

6. A container as in claim 5 wherein said gasket-engaging surface is at an angle to the perpendicular to said first direction.

7. A container as in claim 6 wherein said angle is substantially 45°.

8. A container as in claim 1, and further comprising a compliant pad on the end face of said plunger.

9. A container as in claim 1 wherein said container further comprises gas purging, filtration, and/or pressure conditioning ports to allow the container to be filled and purged with a chosen gas or to withstand pressure variations during shipment without allowing the ingress of gaseous contaminants from outside said container.

10. A container as in claim 1 wherein said container further comprises chemical absorbent material within the container to remove airborne compounds that might lead to degradation of the article.

* * * * *